United States Patent [19]
Goetz et al.

[11] Patent Number: 5,268,256
[45] Date of Patent: Dec. 7, 1993

[54] PHOTOIMAGEABLE ELECTRODEPOSITABLE PHOTORESIST COMPOSITION FOR PRODUCING NON-TACKY FILMS

[75] Inventors: Jonathan D. Goetz, Gibsonia; Charles F. Kahle, II, Allison Park, both of Pa.

[73] Assignee: PPG Industries, Inc., Pittsburgh, Pa.

[21] Appl. No.: 817,207

[22] Filed: Jan. 6, 1992

Related U.S. Application Data

[63] Continuation-in-part of Ser. No. 697,355, Jan. 14, 1991, which is a continuation-in-part of Ser. No. 562,057, Aug. 2, 1990, abandoned.

[51] Int. Cl.$^5$ ................................ G03C 1/73
[52] U.S. Cl. ................... 430/284; 430/935; 204/181.7; 204/181.6; 522/91; 522/77
[58] Field of Search ........ 430/935, 284, 287; 204/181.7, 181.6; 522/91

[56] References Cited

U.S. PATENT DOCUMENTS

| | | | |
|---|---|---|---|
| 3,312,644 | 4/1967 | Miyairi | 260/22 |
| 3,365,471 | 1/1968 | Becke et al. | 260/348 |
| 3,391,097 | 7/1968 | Williamson | 260/18 |
| 3,450,711 | 6/1969 | Megna et al. | 260/326 |
| 3,501,390 | 3/1970 | Turner | 204/181.6 |
| 3,501,391 | 3/1970 | Smith et al. | 204/181.6 X |
| 3,503,979 | 3/1970 | Habermeier et al. | 260/260 |
| 3,513,083 | 5/1970 | Vitek | 204/181.6 X |
| 3,738,835 | 6/1973 | Bakos . | |
| 3,793,278 | 2/1974 | De Bona . | |
| 3,799,854 | 3/1974 | Jerabek | 204/181 |
| 3,894,922 | 7/1975 | Bosso et al. . | |
| 3,935,087 | 1/1976 | Jerabek et al. . | |
| 3,936,368 | 2/1976 | Wantanabe et al. . | |
| 3,936,405 | 2/1976 | Sturni et al. . | |
| 3,937,679 | 2/1976 | Bosso et al. . | |
| 3,954,587 | 5/1976 | Kokawa | 522/97 |
| 3,959,106 | 5/1976 | Bosso et al. . | |
| 4,025,409 | 5/1977 | McGinniss | 204/181 |
| 4,038,232 | 7/1977 | Bosso et al. . | |
| 4,039,414 | 8/1977 | McGinniss . | |
| 4,066,523 | 1/1978 | McGinniss . | |
| 4,105,518 | 8/1978 | McGinniss | 204/181.7 |
| 4,139,510 | 2/1979 | Anderson | 204/181.7 X |
| 4,166,017 | 8/1979 | McGinniss | 204/181.7 |
| 4,260,720 | 4/1981 | Bosso et al. | 528/109 |
| 4,321,304 | 3/1982 | Castellucci . | |
| 4,338,232 | 7/1982 | Harris et al. . | |
| 4,592,816 | 6/1986 | Emmons et al. | 204/180.6 |
| 4,601,916 | 7/1986 | Arachtingi . | |
| 4,632,891 | 12/1986 | Banks et al. . | |
| 4,632,900 | 12/1986 | Demmer et al. . | |
| 4,671,854 | 6/1987 | Ishikawa et al. . | |
| 4,673,458 | 6/1987 | Ishikawa et al. . | |
| 4,746,399 | 5/1988 | Demmer et al. . | |
| 4,751,172 | 6/1988 | Rodriguez et al. . | |
| 4,760,013 | 7/1988 | Hacker et al. . | |
| 4,828,948 | 5/1989 | Ahne et al. . | |
| 4,839,253 | 6/1989 | Demmer et al. | 204/181.7 |
| 4,845,012 | 7/1989 | Seko et al. . | |
| 4,861,438 | 8/1989 | Banks et al. . | |
| 4,863,757 | 9/1989 | Durand . | |
| 4,863,827 | 9/1989 | Jain et al. . | |
| 4,863,828 | 9/1989 | Kawabe et al. . | |
| 4,863,829 | 9/1989 | Furuta et al. . | |
| 4,877,818 | 10/1989 | Emmons et al. . | |
| 4,883,571 | 11/1989 | Kondo et al. . | |
| 4,888,269 | 12/1989 | Sato et al. . | |
| 4,898,656 | 2/1990 | Hoshino et al. . | |
| 4,975,347 | 12/1990 | Ahne et al. . | |
| 5,002,858 | 3/1991 | Demmer et al. | 430/935 |

FOREIGN PATENT DOCUMENTS

| 176356 | 4/1986 | European Pat. Off. . |
| 302827 | 2/1989 | European Pat. Off. . |
| 315165 | 5/1989 | European Pat. Off. . |
| 326655 | 8/1989 | European Pat. Off. . |
| 335330 | 10/1989 | European Pat. Off. . |
| 3337303 | 4/1984 | Fed. Rep. of Germany . |
| 2193727 | 2/1988 | United Kingdom . |

Primary Examiner—Marion E. McCamish
Assistant Examiner—Laura S. Weiner
Attorney, Agent, or Firm—Gary J. Connell; Dennis G. Millman

[57] ABSTRACT

An electrodepositable photoresist composition for producing non-tacky films on an electroconductive substrate comprises an aqueous dispersion of a water-dispersible photosensitive ionic polymeric material and a polyalkylene oxide-modified polysiloxane sufficient to give slip and blocking properties that enables direct placement of a photomask on the resultant dehydrated film. The composition also preferably contains a nonionic unsaturated material and a photoinitiator.

15 Claims, No Drawings

PHOTOIMAGEABLE ELECTRODEPOSITABLE PHOTORESIST COMPOSITION FOR PRODUCING NON-TACKY FILMS

CROSS-REFERENCE TO RELATED APPLICATIONS

This application is a continuation-in-part of application Ser. No. 07/697,355, filed Jan. 14, 1991, entitled "Photoimageable Electrodepositable Photoresist Compositions", in the name of Olson et al., which is a continuation-in-part of application Ser. No. 07/562,057, filed Aug. 2, 1990, entitled "Photoimageable Electrodepositable Photoresist Compositions" in the name of Olson et al., now abandoned, which applications are incorporated by reference herein, and which applications are assigned to the assignee of the present application.

FIELD OF THE INVENTION

The present invention relates to electrodepositable photoresist compositions and, more specifically, to electrodepositable photoresist compositions which form a film on an electroconductive substrate and which film is non-tacky and enables direct contact of a phototool or photomask to the film and release therefrom without damage to the film. Such photoresist compositions are particularly useful in the manufacture of circuit boards and printing plates.

BACKGROUND OF THE INVENTION

Electrodepositable photoresist compositions are generally known in the art. In a broad sense, the art has described photosensitive electrodepositable compositions which are intended to produce permanently adhering films. The art relating to such permanent films, such as paints, is non-informing in the area of photoresist compositions.

Of interest here, are photoresist compositions that form photoimages such as printed circuits or lithographic printing plates. In essence, photoresist compositions form films which are either insolubilized or solubilized with an energy source such as actinic irradiation using a photomask. The use of a mask enables selective irradiation of unmasked areas of the films. The films are then developed by removing the masked or unmasked areas thereof depending on whether the photoresist is negative or positive, respectively.

Electrodeposition of photoresist compositions poses several problems. Some of the shortcomings of the known electrodepositable photoresist compositions reside in problems of tackiness or stickiness and/or the associated problems of poor light sensitivity and resolution. Films of known compositions tend to stick or otherwise adhere to photomasks that are placed on them in the process of producing the required pattern. The photomask (or phototool) is a self-supporting film on which is imposed a pattern of the desired image, or the negative thereof, which is transferred to a substrate. Removal of a photomask from a sticky film can damage the photoresist and/or photomask. The damaged photoresist thus causes an unacceptable image transfer and, consequently, defects in the final products. The damaged photomask becomes unacceptable for subsequent use, thus increasing the cost of production.

The prior art, in an attempt to overcome the above problems, employs cover sheets, such as a Mylar sheet, or coatings which are typically placed over photoresists in order to prevent sticking of the photomasks to photoresists. However, the presence of cover sheets or coatings adversely affects resolution of the image because the mask is thus spaced from the photoresist and incident light is diffracted as it passes through the mask and the cover sheet or coating. The diffraction or "spreading" of the incident light becomes more pronounced as the distance between the photomask and the photoresist increases. Photosensitivity can also be adversely affected if the cover sheet or coating absorbs any of the incident light.

By the present invention, non-tacky photoresist compositions are provided that do not require a cover sheet or coating and provide good photosensitivity and image resolution.

SUMMARY OF THE INVENTION

In accordance with the present invention, an electrodepositable photoresist composition is provided which comprises an aqueous dispersion of a water-dispersible photosensitive ionic polymeric material and a polyalkylene oxide modified polysiloxane sufficient to give desirable slip and blocking properties, as well as crater control properties, to a resultant film without detrimentally affecting the film properties. The electrodepositable photoresist composition, upon electrodeposition on a substrate, forms a non-tacky film to which a photomask may be applied in direct contact with, and subsequently released from, the film without damage to either the film or the photomask. The resultant electrodeposited film is thin and uniform, has good photosensitivity, lacks craters, provides good image resolution, and is effectively insolubilized by selective patterned exposure to actinic radiation, such that the unexposed portion of the film is removable with a dilute aqueous acid and the exposed portion is insoluble in said aqueous acid.

In the presently preferred embodiment of the invention, the electrodepositable photoresist composition comprises an aqueous dispersion of an acid-neutralized amine-functional unsaturated cationic polymeric material. The amine-functional unsaturated cationic polymeric material is preferably an epoxy-amine adduct, for example, the reaction product of a diglycidyl ether and methylethanolamine which is neutralized with an acid such as lactic acid. The epoxy-amine adduct is typically modified by incorporating therein an ethylenically unsaturated group via a covalent bond. Also present in the preferred composition is a nonionic unsaturated compound such as a polyacrylate such as trimethylolpropane triacrylate. The composition also includes a polyalkylene oxide-modified polysiloxane. A photoinitiator is also present and can be, for example, isopropyl thioxanthone.

The invention also encompasses a process for preparing a photoresist and an article of matter on which the photoresist has been applied. The photoresist of the invention is characterized in that it is a thin, uniform (smooth and pinhole-free) electrodeposited non-tacky film.

By the term "non-tacky", herein is meant that a film of the photoresist composition does not stick to or otherwise adhere to a photomask in a manner that would cause an appreciable damage to the photoresist and/or the photomask, as described hereinbefore. The term "photosensitivity" relates to the light exposure dose which is required to insolubilize a film, when it is in contact with a developing solution. Generally, the higher the sensitivity, the lower is the required light exposure dose. Light exposure dose is measured in millijoules per square centimeter. The term resolution relates to a minimum width of lines and spaces of an image from the photomask that can be reproduced accurately on a surface.

DETAILED DESCRIPTION OF THE INVENTION

The electrodepositable photoresist of this invention is characterized in that it forms a thin, uniform electrodeposited film having good crater control, slip and block properties, photosensitivity and image resolution. Film thicknesses can range from about 0.01 to 3 mils and preferably about 0.1 to 1.5 mils. The film is smooth and pinhole-free in that there are no discontinuities in the film which can cause defects in the final product. The dehydrated film of the photoresist composition is non-tacky.

As set forth more fully hereinbelow, the components of the electrodepositable photoresist composition are selected on the basis that gives rise to the above characteristics and other useful compositional and performance properties. The principal ingredients of a preferred composition are a photosensitive ionic polymeric material, a nonionic unsaturated material, a photoinitiator, a polyalkylene oxide-modified polysiloxane and, optionally, a colorant.

The photosensitive ionic material can be photosensitive through any known mechanism for photosensitivity. For example, the material can include unsaturation such that in the presence of actinic radiation and a photoinitiator, the material polymerizes through the unsaturation to become insoluble. Other types of photosensitive materials include polydiazoquinones, or nitrobenzyl alcohols. The photosensitive ionic material can be cationic or anionic, but is preferably cationic.

The preferred photosensitive ionic polymeric material is a cationic, acid-neutralized, unsaturated amine-functional polymeric material. An illustrative example thereof can be an unsaturated epoxy-amine adduct. The useful epoxy materials can be monomeric or polymeric compounds or a mixture of compounds having an average of one or more epoxy groups per molecule. Although monoepoxides can be utilized, it is preferred that the epoxy materials contain more than one epoxy group per molecule. The epoxy materials can be essentially any of the well-known epoxides. A particularly useful class of polyepoxides are polyglycidyl ethers of polyphenols such as bisphenol A. These can be produced, for example, by etherification of a polyphenol with epichlorohydrin in the presence of an alkali. The phenolic compound may be, for example, bis(4-hydroxyphenyl)2, 2-propane, 4, 4'-dihydroxybenzophenone, bis(4-hydroxyphenyl)1, 1-ethane, nonyl phenol, resorcinol, catechol, bis (4-hydroxyphenyl)1, 1-isobutane, bis(4-hydroxytertiary-butylphenyl)2, 2-propane, bis(2-hydroxynaphthyl)methane, 1,5-dihydroxynaphthylene, or the like. In many instances, it is desirable to employ such polyepoxides having somewhat higher molecular weight and preferably containing aromatic groups. These polyepoxides can be made by reacting the diglycidyl ether set forth above with a polyphenol such as bisphenol A. Preferably, the polyglycidyl ether of a polyphenol contains free hydroxyl groups in addition to epoxide groups. While the polyglycidyl ethers of polyphenols may be employed per se, it is frequently desirable to react a portion of the reactive sites (hydroxyl or in some instances epoxy) with a modifying material to vary the film characteristics of the resin.

Another quite useful class of polyepoxides are produced similarly from novolac resins or similar polyphenol resins. Also suitable are the similar polyglycidyl ethers of polyhydric alcohols which may be derived from such polyhydric alcohols as ethylene glycol, diethylene glycol, triethylene glycol, 1,2-propylene glycol, 1,4-propylene glycol, 1,5 pentanediol, 1,2,6-hexanetriol, glycerol, bis(4-hydroxy-cyclohexyl)2,2-propane, and the like. There can also be used polyglycidyl esters of polycarboxylic acids, which are produced by the reaction of epichlorohydrin or similar epoxy compounds with an aliphatic or aromatic polycarboxylic acid such as oxalic acid, succinic acid, glutaric acid, terephthalic acid, 2,6-naphthylene dicarboxylic acid, dimerized linolenic acid, and the like. Examples are glycidyl adipate and glycidyl phthalate. Also useful are polyepoxides derived from the epoxidation of an olefinically unsaturated alicyclic compound. Included are diepoxides comprising in part one or more monoepoxides. These polyepoxides are non-phenolic and are obtained by the epoxidation of alicyclic olefins, for example, by oxygen and selected metal catalysts, by perbenzoic acid, by acetaldehyde monoperacetate, or by peracetic acid. Among such polyepoxides are the epoxy alicyclic ethers and esters which are well-known in the art.

Other epoxy-containing compounds and resins include nitrogenous diepoxides such as disclosed in U.S. Pat. No. 3,365,471; epoxy resins from 1,1-methylene bis(5-substituted hydantoin), U.S. Pat. No. 3,391,097; bisimide-containing diepoxides, U.S. Pat. No. 3,450,711, epoxylated aminoethyldiphenyl oxides, U.S. Pat. No. 3,312,644; heterocyclic N,N'-diglycidyl compounds, U.S. Pat. No. 3,503,979; amine epoxy phosphonates, British Patent 1,172,916; 1,3,5-triglycidyl isocyanurates, as well as other epoxy-containing materials known in the art. The epoxy equivalent weight of the epoxy material (grams of solid resin per equivalent of epoxy) can be 100 to 5,000 and preferably 200 to 1,000.

The amines useful in preparing the polyepoxide amine adduct can be ammonia, primary, secondary and tertiary amines and a mixture thereof. Illustrative examples of the useful amines can be dibutylamine, methyl ethanolamine, dimethylamine, diethanolamine, and the diketimine of diethylene triamine, polyoxyalkylene polyamine such as JEFFAMINES ® (from Texaco Co.), diethylamine, morpholine, dimethylamine, propylamine, diisopropanolamine, butylamine, ethylamine, triethylamine, triethanolamine, dimethylethanolamine and the like or a mixture thereof, e.g., dibutylamine and methylethanolamine. The epoxy-amine adduct is at least partially neutralized with an acid to form a polymeric product containing amine salt and/or quaternary ammonium salt groups. U.S. Pat. No. 4,260,720, column 5, line 20, to column 7, line 4, the portions of which are hereby incorporated by reference, discloses polyepoxide amine adducts and methods of preparing the same.

With regard to the amount of organic amine and polyepoxide which are reacted with one another, the relative amounts depend upon the extent of cationic base, such as cationic salt group formation, desired and this, in turn, will depend upon the molecular weight of the polymer. The extent of the cationic salt group formation and the molecular weight of the reaction product should be selected such that when the resultant cationic polymer is mixed with aqueous medium, a stable dispersion will form. A stable dispersion is one which does not settle or is one which is easily dispersible if some sedimentation occurs. The dispersion should additionally be of sufficient cationic character that the dispersed polymer particles will migrate towards the cathode when an electrical potential is impressed between an anode and a cathode immersed in the aqueous dispersion.

The molecular weight, structure and extend of cationic salt group formation should be controlled such that the dispersed polymer will have the required flow to form a continuous film on the cathode. The film should be insensitive to moisture to the extent that it will not appreciably redissolve in the electrodeposition bath or be easily rinsed away by an aqueous solution from the coated surface after removal from the bath. Also, the molecular weight, structure and extent of cationic salt group formation should be controlled such that the deposited and dehydrated film will be dissolvable in aqueous acids during development of the photoresist film.

In accordance with the invention, the amines, including aromatic amines in the presence of certain photoinitiators, are realized to be "coinitiators" of photopolymerization. Hence, the amine employed herein, as to type and/or amount, can have an appreciable effect on the photosensitivity of the photoresist film. Without being bound by any particular theory, it is believed that the amines as aforestated increase the number of potential crosslinkable sites in the photoresist composition which are capable of participating in the insolubilization reaction. Differently put, the concentration of the reactive sites in the photoresist composition is thereby increased. Thus, the photoresist composition can be more readily insolubilized with a relatively small but effective content of unsaturated groups. Epoxy-amine adducts and preferably epoxy polymers containing an aromatic group, e.g., aromatic epoxy-amine adducts, are believed to be particularly effective in improving photosensitivity of the photoresist composition.

In general, most of the cationic polymers, e.g., the epoxy-amine adducts useful in the practice of the invention will have weight average molecular weights within the range of about 1,000 to 500,000 and contain from about 0.1 to 2, and preferably about 0.2 to 1.0 milliequivalents of basic group, e.g., cationic group, per gram of resin solids. Given the teachings herein, one can couple the molecular weight with the cationic group content to arrive at a satisfactory polymer. The epoxy equivalent weight before amination can be 100 to 5,000 and preferably about 200 to 1,000.

An unsaturated moiety can be introduced into the cationic polymeric material or a precursor thereof. The resultant unsaturated cationic polymeric material contains on the average at least one ethylenically unsaturated moiety per molecule. In a preferred embodiment, the unsaturated moiety is derived from the partial reaction of isophorone diisocyanate with an active hydrogen containing ethylenically unsaturated compound such as 2-hydroxyethyl acrylate. The resultant product is one which contains free isocyanate groups and is then reacted with hydroxyl groups of the aforedescribed polyepoxide adduct. Other than isophorone diisocyanate and the hydroxyethyl acrylate, other polyisocyanates and other compounds, which are preferably diisocyanates, can be substituted therefor in order to produce the isocyanates containing an unsaturated moiety. Illustrative examples of the other polyisocyanates can be aliphatic isocyanates such as alkylene isocyanates, e.g., trimethylene, tetramethylene, pentamethylene, hexamethylene, 1,2-propylene, 1,2-butylene, 2,3-butylene, 1,3-butylene, ethylidene and butylidene diisocyanates and the cycloalkylene isocyanates, e.g., 1,3-cyclopentane, 1,4-cyclohexane, 1,2-cyclohexane diisocyanates and aromatic isocyanates such as arylene isocyanates, e.g., m-phenylene, p-phenylene, 4,4'-diphenyl, 1,5-naphthalene and 1,4-naphthalene diisocyanates and alkarylene isocyanates, e.g., 4,4' diphenyl methane, 2,4- or 2,6-tolylene, or mixtures thereof, 4,4'-toluidine, and 1,4-xylylene diisocyanates; nuclear-substituted aromatic compounds, e.g., dianisidine diisocyanate; 4,4'-diphenylether diisocyanate and chlorodiphenylene diisocyanate. Triisocyanates such as triphenyl methane-4,4',4''-triisocyanate, 1,3,5-triisocyanato benzene and 2,4,6-triisocyanato toluene; and the tetraisocyanate such as 4,4'-diphenyldimethyl methane-2,2',5,5'-tetraisocyanate and polymerized polyisocyanates such as tolylene diisocyanate dimers and trimers and the like can also be used herein.

In addition, the polyisocyanates may be prepolymers derived from polyols such as polyether polyols or polyester polyols, including polyols which are reacted with excess polyisocyanates, such as mentioned above, to form isocyanate-terminated prepolymers. Examples of the suitable isocyanate prepolymers are described in U.S. Pat. No. 3,799,854, column 2, lines 22 to 53, which is herein incorporated by reference.

Illustrative examples of other compounds from which the unsaturated moiety can be derived are hydroxypropyl acrylate, hydroxyethyl methacrylate, t-butylamino ethyl methacrylate, N-methylolacrylamide, and caprolactone-acrylic acid adducts.

An example of another unsaturated isocyanate is meta isopropenyl α,α-dimethyl-isocyanate. Mixtures of the above mentioned unsaturated isocyanates can also be used. The resultant unsaturated polymeric material has pendant unsaturation. By "pendant" is meant unsaturation which is attached to the polymer in a terminal position on the polymer chain.

The useful unsaturated cationic polymeric materials, which are typically amine-functional polymeric materials with pendant unsaturation, can have weight average molecular weights of about 1,500 to 1,000,000 and preferably about 2,000 to 500,000. Unsaturation equivalent (gram solid resin/equivalent of unsaturation) of the material can be from about 750 to 1,000,000 and preferably 1,000 to 50,000. Typically, the glass transition temperature (Tg) of the unsaturated cationic polymeric material is from 0° C. to about 130° C. and more preferably 10° C. to 80° C. Milliequivalents of the basic group, e.g., cationic group, can be 0.1 to 1.0 and preferably 0.2 to 1.0 per gram of resin solids.

In making the amine functional polymeric material cationic, it is at least partially neutralized with an acid, preferably in the presence of water. Illustrative examples of the acid can be lactic and acetic acid, formic, sulfuric, sulfamic, phosphoric, propionic, hydroxyacetic, acrylic, methacrylic, glycolic, butyric, dimethylol propionic, 12 hydroxy stearic, etc. The neutralized material can be dispersed in water during or after the neutralization. The resultant dispersion is useful in a cationic electrodeposition composition. Besides amines, the cationic groups can alternately be introduced into the polyepoxide by reacting into the epoxy groups with a sulfide or phosphine and an acid, thus forming cationic sulfonium or phosphonium groups. Cationic resins that contain both sulfonium and amine salt groups can also be made as described in U.S. Pat. No. 3,935,087 which is hereby incorporated by reference.

As stated above, a nonionic unsaturated material can be employed in combination with the photosensitive ionic material described above. Typically, the nonionic unsaturated materials are blended with the photosensitive ionic materials prior to dispersion in water. The nonionic unsaturated material can be a mono or multi-functional unsaturated material, e.g., a diacrylate of a polyepoxide, or an acrylate ester of an ethoxylated or propoxylated polyphenol, an acrylate ester of trimethylolpropane or pentaerythritol or a mixture thereof. Amounts of about 1 to 70 percent and preferably about 5 to 40 percent by weight of the nonionic unsaturated material, based on total resin solids weight of the bath can be employed. Unsaturation equivalent weight of these nonionic materials can range from about 90 to 1000 or higher. Illustrative but non-limiting examples of the unsaturated nonionic materials can be epoxy acrylates, urethane acrylates, ether acrylates, ester acrylates and ethylenically unsaturated resin such as acrylated melamine resins and acrylated acrylic resins. Preferably, the nonionic unsaturated materials contain 2 or more unsaturated groups per molecule. Specific but non-limiting examples of the preferred nonionic materials can be a diacrylate of a diglycidyl ether of bisphenol A, trimethylolpropane triacrylate, pentaerythritol triacrylate, a diacrylate ester of ethoxylated diphenol and a mixture thereof.

The percent of equivalents of unsaturation derived from the ionic material is from about 5 to 80 percent, and preferably 10 to 50 percent of the total unsaturation equivalents of the photoresist composition. The percent of equivalents of unsaturation derived from the nonionic materials is from about 95 to 20 percent and preferably 90 to 50 percent.

When the photosensitive ionic material contains unsaturation, photoinitiators are included in the composition. As photoinitiators, there are herein employed compounds which will initiate polymerization of the unsaturated groups of the electrodepositable photoresist composition when a film of the photoresist composition is exposed to actinic radiation of an appropriate energy. Illustrative examples of the photoinitiators can be thioxanthones, phosphine oxides, quinones, benzophenones, benzoin, acetophenones, benzoin ethers, and benzil ketals. The preferred photoinitiators can be isopropyl thioxanthone, 1-chloro thioxanthone (or other thioxanthone derivatives), benzoin ethers, e.g., IRGACURE ® 907 (Ciba Geigy Co.), and a combination thereof. The photoinitiator can be made an integral part of the resinous material used herein. However, in the preferred embodiment of the invention, the photoinitiator is external to the resinous material, namely the photosensitive ionic polymeric material. The photoinitiator can be employed in an amount of about 0.05 to about 12 percent and preferably about 0.5 to about 8 percent based on total resin solids. The photoinitiator can be added before, during or after the dispersion is prepared.

The polyalkylene oxide-modified polysiloxanes used in the present invention are polysiloxanes that are non-hydrolyzable. Preferably, the polyalkylene oxide-modified polysiloxanes have a silicon content of between about 5 percent and about 35 percent by weight and most preferably between about 8 percent and about 25 percent by weight. In addition, the Z average molecular weight of the polyalkylene oxide-modified polysiloxane is preferably at least about 5,000. A preferred embodiment of the polyalkylene oxide-modified polysiloxane of the present invention is sold commercially under the trademark SILWET L-7602 by Union Carbide. SILWET L-7602 is partially water soluble, non-hydrolyzable and has a silicon content of about 22.2%. It has a number average molecular weight of 1372, a weight average molecular weight of 5409 and a Z average molecular weight of 12,499. The ratio of weight average molecular weight to number average molecular weight or polydispersity for this compound is 3.94. Other polyalkylene oxide-modified polysiloxanes which are useful in the present invention are sold under the SILWET trademark.

The polyalkylene oxide-modified polysiloxane of the invention is present in the composition in amounts necessary to obtain the desirable properties described herein. More particularly, the polyalkylene oxide-modified polysiloxane is present in amounts of between about 0.05 percent to about 5.0 percent based on total weight of the composition, more preferably between about 0.1 percent and about 2.5 percent and most preferably between about 0.5 percent and about 1.5 percent.

The polyalkylene oxide-modified polysiloxanes of the present composition aid in slip and blocking properties of the composition. The term slip generally refers to the ability of a coating or surface to allow a mass to be pulled across the surface. Slip properties are believed to be related to the coefficient of friction of a surface, with lower coefficients of friction indicating better slip properties. The term blocking refers to ability of a coating or surface to release a mass being pulled directly away from the surface. In preferred embodiments of the present invention, the polyalkylene oxide-modified polysiloxane also provides crater control to improve film-smoothness of coatings.

In preparing the electrodepositable photoresist compositions, the aforedescribed components are combined to produce a dispersible composition. The combined components can be dispersed in an aqueous acid solution such as lactic acid solution. Additional water can be added to the dispersion to reduce the solids content. Also, the dispersion can be stripped in order to remove volatile organic solvents. The resultant dispersion has a resin solids content of about 5 to 50 percent and preferably 10 to 40 percent.

In addition to the above components, various formulating additives can be employed herein. For instance, since film-smoothness is of importance, additives that can decrease surface defects, e.g., crater control agents can be employed herein. Illustrative but non-limiting examples thereof can be chain-extended epoxy materials such as polyepoxide-polyoxyalkylene polyamine adducts, polypropylene oxides, and other high molecular weight cationic polymers. Also, as noted above, in preferred embodiments of the present invention, the polyalkylene oxide-modified polysiloxanes provide crater control.

As electrodepositable photoresist compositions, the pH can be from about 3 to about 9 and preferably about 4 to about 7 and conductivity can be from about 200 to about 2,000 micromhos per centimeter and preferably about 400 to about 1,500 micromhos per centimeter. In the process of electrodeposition, the aqueous dispersion of the photoresist composition is placed in contact with an electrically-conductive anode and an electrically-conductive cathode. The surface to be coated can be made the cathode or the anode. In the case of cationic electrodeposition, which is preferred herein, the surface to be coated is the cathode. Following contact with the aqueous dispersion, an adherent film of the coating composition is deposited on the electrode being coated when a sufficient voltage is impressed between the electrodes. Conditions under which electrodeposition is carried out can be as follows. The applied voltage may be varied and can be, for example, as low as one volt or as high as several thousand volts, but is typically between about 10 and 400 volts. Current density is usually between 1 ampere and 10 amperes per square foot and tends to decrease during electrodeposition indicating the formation of an insulating film. Electrodeposition time can vary from 5 to 200 seconds. The electrodeposited film having a thickness of 0.01 to 3 mil, upon dehydration, is substantially tack-free. Generally, the electrodeposited film is dehydrated by an infrared bake, a short oven bake, or an air blow-off. The non-tacky nature of the film can be measured, for example, by a Sward hardness test in which a metal rocker is placed on the dehydrated photoresist film and set in motion. Softer, more tacky films will damp the rocking motion more quickly than harder, less tacky films. Typically, the Sward Rocker hardness (ASTM D2134-66 modified) of the dehydrated film should be at least 10, and preferably from 10 to 50, measured at room temperature at 55 percent relative humidity.

In the process for preparing the patterned photoresist, a photomask is placed on the dehydrated photoresist which is then exposed to actinic radiation. In accordance with this invention, the dehydrated photoresist can be directly covered with a photomask to make an intimate contact therewith. The photomask (or phototool) is a film on which is printed a pattern which is the negative (or positive) of the desired image. Actinic radiation is shown through the regions of the photoresist film which are transparent to said radiation in order to transfer the image of the photomask onto the photoresist film.

Because the films of the claimed compositions are particularly smooth and non-tacky, intimate contact can be made between the films and photomasks. This minimizes scattering of incident light from an irradiation source, as light passes through the mask. By "intimate contact" is meant that little or no space is left between the photomask and the photoresist. As aforestated, the prior art photoresists typically are tacky and thus often require covers in the form of sheets or protective coatings in order to protect photomasks. These covers make intimate contact between the photomasks and the photoresists impossible. The greater the separation between the photomasks and the photoresists, the greater is the amount of light diffraction that takes place before light impinges on the photoresists. Consequently, there is a reduced accuracy of the transfer of the photomask images into the photoresists. Therefore, intimate contact between mask and photoresist is desirable and is provided in accordance with the present invention in order to achieve maximum accuracy of image transfer and resolution. In the instance of this invention less than 500 millijoules per square centimeter and preferably less than 200 millijoules per square centimeter of light exposure dose (irradiation) is required to insolubilize an electrodeposited and dehydrated film having a thickness of less than or equal to 0.4 mil (on a flat surface) when it is exposed to dilute aqueous acidic solution. Irradiation can be conducted with ultraviolet (UV) light produced by various lamps having an average emission wavelength of 200 to 700 nanometers (nm). Generally, the conditions for irradiation will depend on the nature of the source of irradiation, film thickness and the like.

After irradiation and removal of the photomask, the photoresist film is developed. In the preferred embodiment of this invention, the photomask is removed easily without any significant photoresist film remaining thereon. Without being bound to any particular theory, it is believed that the photomask is effectively removed because of the hardness and non-tacky nature of the films of the electrodepositable composition.

Development of the photoresist entails subjecting it to a developing solution by spraying, dipping or the like. The developing solution for cationic polymeric materials is usually an acidic aqueous solution. The acids useful herein can be the same as used in neutralizing the polymeric material as aforedescribed. Illustratively, lactic acid, acetic acid, formic acid, propionic acid and dimethylolpropionic acid can be used herein, with lactic acid or acetic acid being preferred. Usually, the photoresist film is developed at a temperature of 0° F. to 180° F. over a period of 10 seconds to 10 minutes. Typically, the concentration of the acid in the developing solution can be from 0.05 to 20 weight percent in water. The exposed areas of a negative photoresist become insolubilized, i.e., less soluble to a developing solution. The opposite is true for positive photoresists. Hence, there is a solubility differential between the exposed and unexposed areas of the photoresist film, and the developing solution removes one or the other. The term solubility differential denotes that the rate of removal of the film by the developing solution is slower in the exposed areas (negative resist) relative to the unexposed areas. For a negative photoresist, the unexposed areas of the film are removed. After the development, the portion of the substrate that is not covered by the photoresist is etched to form a circuit.

Etching involves the removal of the conductive substrate that is not covered with the photoresist film. Etching is conducted by subjecting the uncovered substrate to an etchant such as ferric chloride solutions, cupric chloride solutions, alkaline ammoniacal etchants, peroxides, or sulfuric acid. The etchant is usually sprayed onto the developed surfaces. The etchant is usually at a temperature of about 0° F. to 150° F. and remains on the surface of the substrate for a sufficient time (about 1 to 20 minutes) to remove the exposed copper metal. It is of note that cationic polymers are resistant to alkaline etchants. Amine functional epoxy resins are not expected to swell in alkaline etchants. Thus, resolution is not compromised.

After etching, in conventional processes, stripping means are employed to remove the remaining photoresist film from the substrate. Stripping solutions comprising aqueous acids can be employed when cationic polymers are used. Usually stripping is conducted by placing the etched substrate in the stripping solution at a temperature of about room temperature to about 212° F. over a period of about 10 seconds to 10 minutes. Photoresist film is removed from the unetched copper by this treatment.

This and other aspects of the invention are described by the following non-limiting example.

EXAMPLE

A mixture was formed from 43.93 g. of a cationic blue colorant paste and 3701.7 g. of an electrophoretic photoresist cationic epoxy resin having acrylate functionality prepared according to the procedure described in Example 1B of the parent case, Ser. No. 07/697,355, except that the epoxy equivalent weight of the epoxy was 800, the level of IPTX was 8%, the IPTX was blended with the resin, and Sartomer 349, an ethoxylated bisphenol A diacrylate available from Sartomer, was used instead of EBECRYL 3600. This mixture was reduced with 8254.4 g. of deionized water. The resultant electrophoretic paint had a pH of 4.08 and a conductivity of 690 μmhos. The paint had a solids content of 9.18 percent by weight.

The above-prepared paint composition was divided into five aliquots of 2000 g. apiece, Aliquots A to E. Aliquot A was a control to which no additive was charged. Aliquots B to E had commercially available polyalkylene oxide-modified polysiloxanes added (1% by weight of paint solids) thereto dropwise under mild agitation. The polyalkylene oxide modified polysiloxanes added to Aliquots B-E were as follows. Aliquot B—SILWET L-7602 containing about 22.2% silicon and having a Z average molecular weight of about 12,499. Aliquot C—SILWET L-7600 containing about 8.2% silicon and having a Z average molecular weight of about 11,889. Aliquot D—SILWET L-7500 containing about 7.0% silicon and having a Z average molecular weight of about 9948. Aliquot E—SILWET 77 containing about 12.2% silicon and having a Z average molecular weight of about 1122. The SILWET compositions are available from Union Carbide. The silicon content of the SILWET compounds was determined by averaging two silicon content values obtained from diluting a SILWET compound in methanol and comparing the diluted sample with a known silicon standard in a Perkin Elmer 2100 atomic absorption unit. The Z average molecular weight of the SILWET compounds was determined by gel permeation chromatography using polystyrene standards. The properties of the Aliquots were measured following overnight stir and are listed in Table I.

Epoxy fiberglass circuit boards measuring 8 cm × 12.5 cm with one-half ounce per square foot copper on one side were placed in a detergent solution (ASTM 02248-65) at 74° C. for five minutes. The boards were then washed with hot water followed by a deionized water rinse and an oven bake of 82° C. for 5 minutes. The boards were submerged in individual electrophoretic baths (Aliquots A-E) along with a stainless steel cooling/heating coil which also functioned as a counter electrode. The board and coil were attached to a D.C. power supply, the board being the cathode and the coil being the anode. The bath temperature was held at 35° C. and a magnetic stirrer was used to provide mild agitation. A coat out dwell time of 30 seconds was used for all boards and film build was controlled by varying the coat out voltage. A standard film thickness of approximately 0.3 mil was obtained for all boards. The applied voltage to obtain this film thickness for each board is listed in Table I. Appearance was measured at two different bake temperatures, 140° C. and 80° C. (dwell time 1 minute for each). Both the general appearance as well as approximate number of craters per inch for each board are listed in Table I. At 80° C., no craters were noticed on any of the boards, while at 140° C., all of the organic polysiloxane-containing films showed reduced cratering. Board D, however, also showed heavy texturing of the film. Board B, containing SILWET 7602 showed the best appearance as well as 0 craters/inch$^2$ at both bake temperatures.

TABLE I

| | | PROPERTIES OF TESTED PAINTS | | | | |
|---|---|---|---|---|---|---|
| Aliquot | Organic Polysiloxane | PH | Conductivity | Voltage for 0.3 mil | Appearance 1 min @ 140° C. | Appearance 1 min @ 80° C. |
| A | None | 4.08 | 690 μmho | 140V | 90 craters/in$^2$ | 0 craters/in$^2$ Smooth |
| B | Silwet L-7602 | 4.18 | 680 μmho | 150V | 0 craters/in$^2$ Smooth | 0 craters/in$^2$ Smooth |
| C | Silwet L-7600 | 4.16 | 700 μmho | 140V | 1 crater/in$^2$ Smooth | 0 craters/in$^2$ Smooth |
| D | Silwet (a) L-7500 | 4.10 | 680 μmho | 140V | 0 craters/in$^2$ heavily textured | 0 craters/in$^2$ Smooth sl haze |
| E | Silwet (b) 77 | 4.07 | 685 μmho | 140V | 7 craters/in$^2$ Smooth | 0 craters/in$^2$ Smooth |

(a) Some incompatibility exhibited upon filtration through a Kimpac paint strainer.
(b) Increased foaming exhibited on pouring.

The coefficient of friction for the coated panels was measured using a horizontal pull test. Evaluation was performed with both the facing of the test sled and the coating surface dry. The mass of the sled was 2003 grams and the sled facing type was three smooth steel balls. The test sled traverse speed was 5 inches per minute. Results are listed in Table II. Aliquot films 2A, 2C and 2E all went off the scale and showed a coefficient of friction of greater than 0.35. The test sled left a heavy mar on these panels. Aliquot film 2B showed a reduced coefficient of friction to 0.10 and no mar was noticed. Aliquot film 2D showed the lowest coefficient of friction at 0.03 and a slight mar was made.

Blocking was measured at different temperatures in a forced air oven. Samples were cut from each coated test piece to a size of 2¾ in. × ⅛ in. The samples were centered on a steel plate with the coating side up. A 3" × 1" Corning micro slide was placed in contact with the coating surface. On top of the slide was centered another steel plate weighing 3422.5 grams and on top of the steel plate was centered a 2 kg balance weight. Dwell time in the oven was 2 minutes. As shown in Table II, at all temperatures, 2B showed the best block resistance. Samples 2C and 2D showed some improvement in block resistance over 2A (control). Sample 2E gave consistently poorer blocking results than the control.

TABLE II

| Aliquot | Coefficient of Friction | | BLOCKING OVEN TEMP. | | | | | | |
|---|---|---|---|---|---|---|---|---|---|
| | Value | Mar | 72° F. | 80° F. | 90° F. | 100° F. | 110° F. | 120° F. | 130° F. |
| A | 0.35+ | Heavy | 5 | 5 | 3 | 2 | 2 | 1 | 0 |
| B | 0.10 | None | 5 | 5 | 5 | 4 | 4 | 2 | 2 |
| C | 0.35+ | Heavy | 5 | 5 | 5 | 2 | 3 | 1 | 0 |
| D | 0.03 | Very Slight | 5 | 5 | 3 | 3 | 2 | 1 | 0 |
| E | 0.35+ | Heavy | 5 | 3 | 2 | 2 | 2 | 0 | 0 |

Blocking Ratings
5 - No Stick, No damage
4 - Stick, Surface damage only
3 - Stick, Slight amount of paint pulled from copper surface
2 - Stick, Moderate amount of paint pulled from copper surface
1 - Stick, Heavy amount of paint pulled from copper surface
0 - Stick, Very Heavy amount of paint pulled from copper surface Sample 2A was compared with Sample 2B for U.V. sensitivity and resolution. Panels were exposed with 200 μj/cm² on a vacuum frame exposure unit from ORC. A test pattern with line/space width of 1 mil/1 mil to 20 mil/20 mil was used to test for resolution. A twenty step Stouffer step tab was used to test for sensitivity. Following exposure, panels were run through a developer containing a 3% solution of ELECTRO IMAGE ™ Developer 145 commercial photoresist developing solution using a line speed of 6 ft./min. (20 second dwell time) and a solution temperature of 92° F. Following developing, both samples showed good resolution to 1 mil and held a strong 4 on the Stouffer scale. The polyalkylene oxide-modified polysiloxane apparently did not adversely affect the U.V. sensitivity or line space resolution.

As is seen from the above results, the use of a polyalkylene oxide-modified polysiloxane (Aliquots B, C and D) with a silicon content of between about 5 to 35 percent and a Z average molecular weight of at least 5,000 provided good crater control at both 140° C. and 80° C. and improved blocking properties in a non-tacky electrodeposited film, whereas the control (Aliquot A) and the polyalkylene oxide-modified polysiloxane with a low Z average molecular weight (Aliquot E) gave less desirable properties.

What is claimed is:

1. An electrodepositable photoresist composition comprising an aqueous dispersion of:
   (a) a water-dispersible photosensitive ionic polymeric material; and
   (b) a polyalkylene oxide-modified polysiloxane, wherein, upon coating of a substrate by electrodeposition with said electrodepositable photoresist composition, a non-tacky film is formed to which a photomask may be applied in direct contact therewith, and released therefrom without damage to said film or photomask.

2. An electrodepositable photoresist composition as defined in claim 1 wherein said polyalkylene oxide-modified polysiloxane has a silicon content of between about 5 and about 35 percent by weight, and a Z average molecular weight of at least 5,000.

3. An electrodepositable photoresist composition as defined in claim 2 wherein said polyalkylene oxide-modified polysiloxane has a silicon content of between about 8 and about 25 percent by weight.

4. An electrodepositable photoresist composition as defined in claim 1 wherein the water-dispersible photosensitive ionic polymeric material is an unsaturated cationic polymeric material.

5. An electrodepositable photoresist composition as defined in claim 4 wherein the water-dispersible unsaturated cationic polymeric material is an amine-functional unsaturated polymeric material.

6. An electrodepositable photoresist composition as defined in claim 5 wherein the water-dispersible unsaturated cationic polymeric material is made from an epoxy-functional polymer and an amine or a mixture of amines.

7. An electrodepositable photoresist composition as defined in claim 5 wherein the amine-functional unsaturated polymeric material is derived from ammonia, a primary amine, a secondary amine, a tertiary amine or a mixture thereof.

8. An electrodepositable photoresist composition as defined in claim 5 wherein the amine-functional unsaturated polymeric material is derived from an epoxy polymer.

9. An electrodepositable photoresist composition as defined in claim 1 wherein the photosensitive ionic polymeric material is an unsaturated cationic polymeric material containing an average of at least one ethylenically unsaturated moiety per molecule.

10. An electrodepositable photoresist composition as defined in claim 9 wherein the ethylenic unsaturation is derived from a partially blocked isocyanate which is a reaction product of a polyisocyanate and an active hydrogen-containing ethylenically unsaturated compound.

11. An electrodepositable photoresist composition as defined in claim 10 wherein the active hydrogen-containing ethylenically unsaturated compound is selected from the group consisting of 2-hydroxyethyl acrylate, 2-hydroxyethyl methacrylate, 2-hydroxypropyl acrylate, 2-hydroxypropyl methacrylate, t-butyl amino ethylmethacrylate, t-butyl amino ethylacrylate and mixtures thereof.

12. An electrodepositable photoresist composition as defined in claim 1, including a nonionic unsaturated material.

13. An electrodepositable photoresist composition as defined in claim 12 wherein the nonionic unsaturated material is selected from the group consisting of a diacrylate of a diglycidyl ether of bisphenol A, trimethylolpropane triacrylate, pentaerythritol triacrylate or a diacrylate ester of ethoxylated diphenols and a mixture thereof.

14. An electrodepositable photoresist composition as defined in claim 1, including a photoinitiator.

15. An electrodepositable photoresist composition comprising an aqueous dispersion of:
(a) a water-dispersible unsaturated cationic epoxy-functional polymeric material;
(b) a polyalkylene oxide-modified polysiloxane having a silicon content of between about 5 and about 35 percent by weight and a Z average molecular weight of at least 5,000; and
(c) a nonionic unsaturated material.

* * * * *